United States Patent
Foley

(10) Patent No.: US 10,838,603 B2
(45) Date of Patent: Nov. 17, 2020

(54) PROGRAMMABLE WAVEFORM SIMULATOR

(71) Applicant: nLIGHT, Inc., Vancouver, WA (US)

(72) Inventor: Robert Joseph Foley, Portland, OR (US)

(73) Assignee: nLIGHT, Inc., Vancouver, WA (US)

( * ) Notice: Subject to any disclaimer, the term of this patent is extended or adjusted under 35 U.S.C. 154(b) by 956 days.

(21) Appl. No.: 15/340,705

(22) Filed: Nov. 1, 2016

(65) Prior Publication Data

US 2017/0147191 A1   May 25, 2017

Related U.S. Application Data

(60) Provisional application No. 62/258,161, filed on Nov. 20, 2015.

(51) Int. Cl.
| | |
|---|---|
| G06F 3/0484 | (2013.01) |
| G06F 30/20 | (2020.01) |
| H01S 3/10 | (2006.01) |
| G06F 3/0482 | (2013.01) |
| G06F 3/0481 | (2013.01) |
| H01S 3/11 | (2006.01) |

(52) U.S. Cl.
CPC ........ G06F 3/04847 (2013.01); G06F 3/0482 (2013.01); G06F 30/20 (2020.01)

(58) Field of Classification Search
None
See application file for complete search history.

(56) References Cited

U.S. PATENT DOCUMENTS

| | | | |
|---|---|---|---|
| 2006/0113375 A1* | 6/2006 | Caiger | B23K 26/032 235/376 |
| 2008/0288898 A1* | 11/2008 | Boyle | G06F 30/367 716/133 |
| 2009/0135863 A1* | 5/2009 | Tseng | H01S 3/10 372/25 |
| 2010/0259532 A1 | 10/2010 | Tatara et al. | |

(Continued)

FOREIGN PATENT DOCUMENTS

| | | |
|---|---|---|
| CN | 1806244 | 7/2006 |
| CN | 101456298 | 6/2009 |
| CN | 101774090 | 7/2010 |

(Continued)

OTHER PUBLICATIONS

Lesson 1: Transmitter—External Modulated Laser, Oct. 28, 2014, 23 pages (Year: 2014).*

(Continued)

*Primary Examiner* — Yongjia Pan
(74) *Attorney, Agent, or Firm* — Klarquist Sparkman, LLP

(57) ABSTRACT

A system includes a laser system situated to generate a laser beam, a controller situated to control a path of the laser beam on a target and to control a variation of one or more waveforms associated with the laser beam, and a display coupled to the controller and situated to display a plurality of list data portions that include waveform parameters and a simulated waveform based on the plurality of list data portions, wherein the simulated waveform includes a plurality of simulated waveform portions that are predictive of the one or more waveforms.

24 Claims, 9 Drawing Sheets

(56) References Cited

U.S. PATENT DOCUMENTS

2015/0372447 A1* 12/2015 Song ................... H01S 3/0057
                                                              372/21

FOREIGN PATENT DOCUMENTS

| CN | 103108721 | 5/2013 |
| CN | 104903044 | 9/2015 |
| JP | 2011-033476 | 2/2011 |

OTHER PUBLICATIONS

Using the Laser Measured Component, Oct. 30, 2014, 7 pages (Year: 2014).*
Advanced Modulation Formats, Oct. 27, 2014, 11 pages (Year: 2014).*
Lesson 8: Optical Systems—Working With Multimode Components, Oct. 28, 2014, 26 pages (Year: 2014).*

* cited by examiner

| | | Select Program | Program 1 | ▼ | |
|---|---|---|---|---|---|
| | Label | Command | Parameter 1 | Parameter 2 | |
| | | Power Time-Ramp ▼ | 132.380 | 199 | |
| | | Power Time-Ramp ▼ | 170.580 | 159 | |
| | | Modulate ▼ | 100.000 | 50 | |
| | | Power Time-Ramp ▼ | 216.040 | 176 | |
| | | Power Time-Ramp ▼ | 540.320 | 46 | |
| | | Modulate ▼ | 1.000 | 100 | |
| | | Wait - Delay ▼ | 132.100 | 0 | |
| | L7 | Power Time-Ramp ▼ | 79.170 | 142 | |
| | | Wait - Delay ▼ | 270.310 | 0 | |
| | | Power Time-Ramp ▼ | 138.670 | 46 | |
| | | Power Time-Ramp ▼ | 99.510 | 103 | |
| | | Wait - Delay ▼ | 178.410 | 0 | |
| | | Power Time-Ramp ▼ | 52.160 | 46 | |
| | | Goto - Counter ▼ | 2 | L7 | |
| | | Power Time-Ramp ▼ | 109.230 | 0 | |
| | | Stop ▼ | 0 | 0 | |

FIG. 2B

PROGRAMMABLE WAVEFORM SIMULATOR

CROSS REFERENCE TO RELATED APPLICATION

This application claims the benefit of U.S. Provisional Patent Application No. 62/258,161, filed Nov. 20, 2015, which is incorporated by reference herein in its entirety.

FIELD

The disclosure pertains to laser waveform profiles and simulations of laser waveform profiles.

BACKGROUND

Developments in laser system technology has allowed for an ever increasing expanse of industrial implementations of laser beams. Beams can be directed to one or more targets to cut, weld, anneal, ablate, heat, melt, or produce another type of laser processing based effect on or in the target, in a selective fashion. Various patterns can be formed at the target with the laser process based on the waveform characteristics associated with the laser system. However, despite the promise of robust laser performance, laser-formed patterns and features often suffer from poor quality control, with imprecise or inaccurately shaped patterns the norm. Hence, further innovation to overcome these drawbacks is needed.

SUMMARY

According to one aspect of the disclosed technology, a system includes a laser system situated to generate a laser beam, a controller situated to control a path of the laser beam on a target and to control a variation of one or more waveforms associated with the laser beam, and a display coupled to the controller and situated to display a plurality of list data portions that include waveform parameters and a simulated waveform based on the plurality of list data portions, wherein the simulated waveform includes a plurality of simulated waveform portions that are predictive of the one or more waveforms.

According to another aspect of the disclosed technology, a method includes forming a plurality of list data portions including laser waveform parameters that are associated with a plurality of waveform portions of an waveform associated with a laser system, simulating the waveform based on the plurality of list data portions so as to produce a simulated waveform that includes a plurality of simulated waveform portions that are predictive of the waveform portions, and displaying the simulated waveform on a display.

According to a further aspect of the disclosed technology, a system includes a graphical user interface (GUI), at least one processor, and one or more computer-readable storage media including stored instructions that, responsive to execution by the at least one processor, cause the system to display on the GUI a plurality of list data portions that correspond to waveform parameters of a plurality of output laser waveform portions of an output laser waveform and to display a simulated output laser waveform that is generated based on the plurality of list data portions, wherein the simulated output laser waveform includes a plurality of simulated output laser waveform portions that are predictive of the output laser waveform.

The foregoing and other features and advantages of the disclosed technology will become more apparent from the following detailed description, which proceeds with reference to the accompanying figures.

BRIEF DESCRIPTION OF THE DRAWINGS

FIG. 2A-2D illustrates an example programming environment.

DETAILED DESCRIPTION

Figure 1:
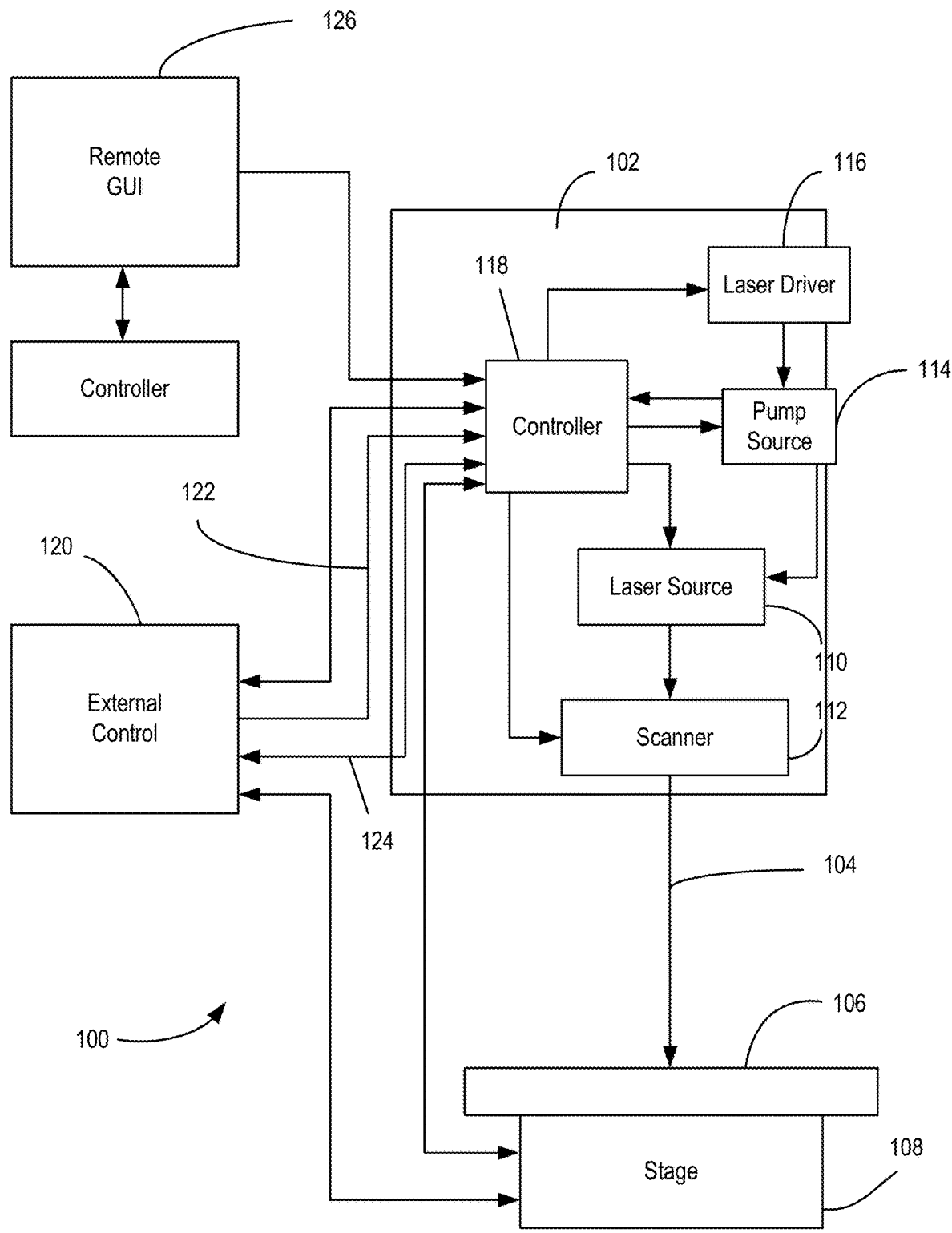
FIG. 1 is a schematic of a laser system coupled to a remote graphical user interface.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

As used herein, laser beams and related powers refer to electromagnetic radiation at wavelengths of between about 100 nm and 10 µm, and typically between about 500 nm and 2 µm. Examples based on available laser diode sources and optical fiber laser and fiber amplifier sources generally are associated with wavelengths of between about 800 nm and 1700 nm. In some examples, propagating optical radiation is referred to as one or more beams having diameters, asymmetric fast and slow axes, beam cross-sectional areas and beam spot sizes, and beam divergences that can depend on beam wavelength and the optical systems used for beam shaping. For convenience, optical beam can be referred to as light in some examples, and need not be at visible wavelengths.

Representative embodiments of pump and laser sources are described with reference to optical fibers, but other types of optical waveguides can be used having square, rectangular, polygonal, oval, elliptical or other cross-sections. Optical fibers are typically formed of silica (glass) that is doped (or undoped) so as to provide predetermined refractive indices or refractive index differences. In some, examples, fibers or other waveguides are made of other materials such as fluorozirconates, fluoroaluminates, fluoride or phosphate glasses, chalcogenide glasses, or crystalline materials such as sapphire, depending on wavelengths of interest. Refractive indices of silica and fluoride glasses are typically about 1.5, but refractive indices of other materials such as chalcogenides can be 3 or more. In still other examples, optical fibers can be formed in part of plastics. In typical examples, a doped waveguide core such as a fiber core provides optical gain in response to pumping, and core and claddings are approximately concentric. In other examples, one or more of the core and claddings are decentered, and in some examples, core and cladding orientation and/or displacement vary along a waveguide length.

The term brightness is used herein to refer to optical beam power per unit area per solid angle. In some examples, optical beam power is provided with one or more laser diodes that produce beams whose solid angles are proportional to beam wavelength and inversely proportional to beam area. Selection of beam area and beam solid angle can produce pump beams that couple selected pump beam powers into one or more core or cladding layers of double, triple, or other single or multi-clad optical fibers. Beam cross-sectional areas, diameters, or other beam dimensions can be described using boundaries that generally correspond to a zero intensity value, a 1/e value, a $1/e^2$ value, a full-width half-maximum (FWHM) value, or other suitable metric.

FIG. 1 shows a system 100 that includes a laser system 102 situated to produce a laser beam 104 and direct the laser beam 104 to a target 106 coupled to a movement stage 108. The laser system 102 generally includes a laser source 110 that generates the laser beam 104 and a scanner 112 that receives the laser beam 104 and directs the laser beam 104 to the target 106. Suitable examples of the scanner 112 can include galvanometer scanners, acousto-optic modulators, fast scan mirrors, movable laser heads, etc. In further examples, the scanner 112 can include optics to direct the laser beam 104 to a predetermined position and the movement stage 108 can move the target 106 relative to the predetermined position. A pump source 114 is coupled to the laser source 110 and provides pump energy to the laser source 110 for generation of the laser beam 104. The pump source 114 typically includes one or more laser diodes, laser diode pump modules, fiber lasers, electrical power supplies, etc., situated to generate pump energy for laser source 110. In some example pump sources, a laser driver 116 is coupled to the pump source 114 and provides a voltage waveform to the pump source 114 so that the pump energy is provided as an optical beam to the laser source 110 and the laser beam 104 is generated based on the voltage waveform with a corresponding laser waveform. Herein, waveforms includes a temporal variation in voltage, current, or optical power.

A controller 118 provides a waveform command to the laser driver 116 to direct the laser driver 116, pump source 114, and laser source 110 to generate the laser beam 104 in accordance with the waveform command. The controller 118 can also be coupled to one or more components of the system 100 or the laser system 102, such as the scanner 112 to control scanning of the laser beam 104 and the target 106 with the waveform command. The controller 118 can also be coupled to the movement stage 108 to control movement of the movement stage 108 relative to the scanning or position of the laser beam 104 based on the waveform command. In representative examples, an external signal source such as an external controller 120 is coupled to the controller 118 of the laser system 102 so as to provide the laser system 102 with the waveform command, selection of a controller program, or other instructions to form the waveform command so that the laser system 102 generates the laser beam 104 based on the instructions from the external controller 120. In some examples, the external controller 120 is coupled to the movement stage 108 and can provide the instructions to produce and/or scan the laser beam 104 to the laser system 102 in coordination with control of movement and calibration or monitoring of the movement stage 108. The external controller 120 can also be coupled to other systems and components that can be coordinated with the laser system 102 and processing of the target 106, such as preceding or subsequent assembly line components and laser or non-laser processing equipment.

In representative embodiments, a sync input 122 is coupled from the external controller 120 to the controller 118 so as to provide a sync input signal that can indicate a readiness of the external controller 120 to proceed with laser processing according to a selected waveform command in the controller 118. A low value for the sync input signal can correspond to pause state for the laser system 102 so that the target 106 can be moved by the movement stage 108 or a new target can be positioned in view of the field of view or processing field of the laser beam 104, and a high value for the sync input signal can correspond to execution state or execution period in which the waveform command in the controller 118 is executed. A sync output 124 is coupled from the controller 118 to the external controller 120 so as to provide a sync output signal that can indicate completion of a waveform command or other feedback to the external controller 120 that is associated with the laser system 102. For example, a high state or other signal feature for the sync output signal can confirm readiness for stage movements controlled by the external controller 120.

A graphical user interface (GUI) 126 is also coupled to the controller 118 and can provide configurability, visualization, and simulation of the waveform command of the controller 118, sync input 122, and sync output 124, as well as other programming of the controller 118. It is typically difficult to determine the shape and correspondence of a waveform output of the laser system 102, such as an optical power of the laser beam 104 or a supply voltage to the pump source 114, to a waveform command program of the controller 118. With the GUI 126, a waveform command program can be entered by a user in a variety of ways and the waveform command corresponding to user entry can be visualized. The GUI 126 is associated with a controller 128 that can process the waveform command and produce a simulated waveform that is predictive of one or more waveform outputs of the laser system 102 based on the dynamics of the components of the laser system 102, such as slew rates in laser driver 116 and controller 118, optical response times of the pump source 114 and laser source 110, mechanical response times associated with the scanner 112 or movement stage 108, optical aberrations or effects of lens and mirror components of the laser system 102, and material dependent effects associated with the target 106 or laser application. In further examples, the various effects introduced by the laser system 102, external controller 120, and target 106 are modeled and the simulated waveform can be adjusted to reduce the impact of the various effects on the one or more waveform outputs. The waveform command can then be adapted to correspond to the adjusted simulated waveform to provide laser operation, such as optical power and position for the laser beam 104, that is closer to a desired waveform.

FIGS. 2A-2D are illustrations of an example waveform programming environment 200 operable to visualize and program waveform commands for one or more controllers and associated laser systems. The illustrated environment 200 includes a computing device 202 that can be a desktop or laptop computer, a mobile device, tablet, supervisory control and data acquisition (SCADA) unit, a logic controller and display combination, etc. The computing device 202 includes a processor 204 that is representative of various types, such as one or more CPUs, GPUs, or other logic processing device, and that can perform various data processing functions for the computing device 202. A memory is 206 that can be volatile or non-volatile (e.g., RAM, ROM, flash, hard drive, optical disk, etc.) and fixed or removable is coupled to the processor 204 and can provide storage capacity for one or more computer-readable media. One or more system buses can provide a communication path between various environment components.

A plurality of input/output devices 208 are coupled to the processor 204 for various input, output, or input/output functions. For example, a display 210 provides a visual output for graphical elements or buttons 211 representing data and waveforms input by a user or processed by the processor 204, and an interface through which the user can enter waveform command data. A touchscreen or keyboard 212 (which can also include one or more pointing devices) provides a way for the user to provide data input and to interact with the graphical elements 211 of the display 210. In typical examples, the computing device 202 includes a laser system I/O 214 that can couple to a laser system so that waveform command programs or command lines can be transferred to the laser system or executed on the laser system with the computing device 202. The laser system I/O 214 can also provide a source for laser system information, such as laser beam power, pump source powers, pump supply voltages, etc., that can be visualized on the display 210, including in real-time. In further examples, the computing device 202 includes an external control I/O 216 that can be coupled to an external signal source such as an external controller, detectors, command buses, etc.

The computing device 202 also includes one or more applications 218 that can provide various visual elements such as windows 220, 222, 224. Visual elements provided by the applications 218 can include graphical user interfaces, device outputs, real-time graphical outputs, fixed or editable spreadsheets, fixed or editable graphs, and various visual sub-elements, such as selectable menu items, data entry fields, and data display fields, by way of example. The applications 218 can also route data from the various inputs (including user entered data), such as the laser system I/O 214 and external control I/O 216 to various outputs, including the display 210 as well as the laser system and external controller. In typical examples, waveform program files can be stored in the memory 206 and uploaded to or retrieved from the laser system coupled to the laser system I/O 214. Applications 218 typically include program modules include routines, programs, objects, components, data structures, etc., that perform particular tasks or implement particular abstract data types. The waveform programming environment 200 can also be distributed so that applications and tasks are performed by remote processing devices that are linked through a communications network. In a distributed computing environment, program modules may be located in both local and remote memory storage devices.

In some embodiments, one or more of the applications 218 can provide the window 220, as illustrated in FIG. 2B, that includes a graphical user interface 228 and a waveform data list 230 that includes a plurality of list data portions 232. One or more of the list data portions 232 can include a menu selectable command line type 234, such as a waveform ramp, step, modulation, delay, repetition, sync-in waveform low or high state, sync-out waveform low or high state, or another type. The corresponding one or more list data portion 232 can include one or more user selectable parameters, such as parameter fields 236, 238 associated with the selected command line type 234. A label field 240 can also be provided for the corresponding one or more list data portions 232 and can indicate a loop or goto position associated with a waveform repetition. Different waveform command programs can be stored in the memory 206 and accessed from a program selection menu 241.

For example, a first list data portion 242 includes a laser beam power time-ramp command with a first parameter field having a value of 132.380 that indicates a duration for the power time-ramp command. A second parameter field has a value of 199 that indicates optical beam power value to be reached at an end of the duration specified in the first parameter field. In some examples, additional parameter fields are provided so that more complex waveform commands can be specified. A second list data portion 244 subsequent to the first list data portion 242 includes a laser beam waveform modulation command that has a modulation period of 100 ms per modulation cycle in a first parameter field and modulation duty cycle of 50% in a second parameter field. In typical examples, the modulation command will alternate between 100% and 0% laser beam power, though other beam powers and modulation shapes (such as sinusoidal, step-wise sinusoidal, etc.) are possible. In another subsequent list data portion 246, a waveform repetition command provides a repetition quantity of two in a first parameter field and a command line label 'L7' in a second parameter field. Thus, during waveform creation based on the list data portions 232, the set of list data portions 232 between the list data portion 246 and the command line indicated with the specified label are repeated for the specified number of cycles.

Figure 2A:
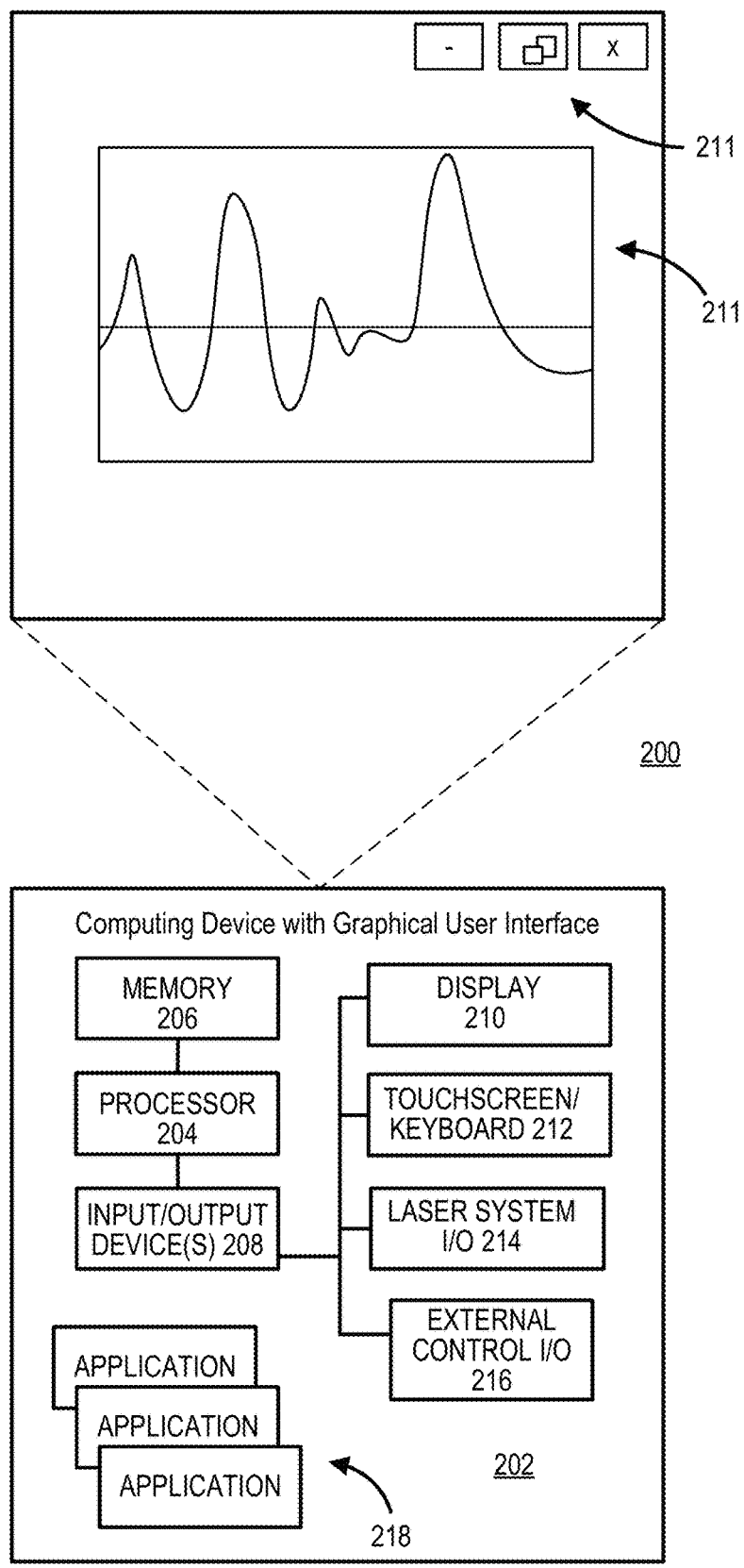
Figure 2C:
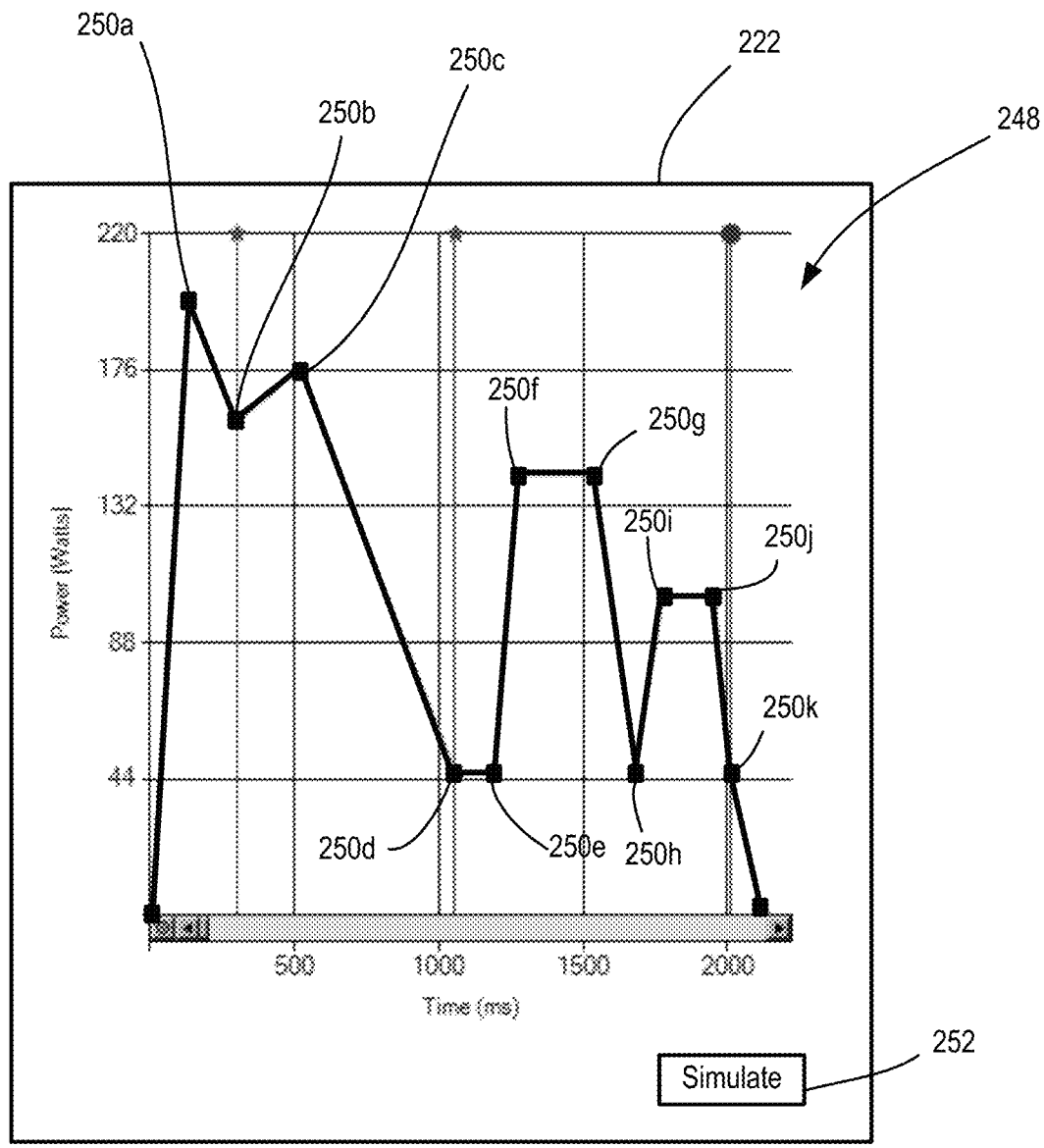

The same or a different application of the applications 218 that provides window 220 can provide or be linked to the window 222 illustrated in FIG. 2C. The window 222 includes a graphical visualization that can include a graph-oriented graphical user interface (GUI) 248 capable of generating waveforms that correspond to user inputs. In one embodiment, a user can select points on the graph-oriented GUI 248, such as waveform output powers 250a-250k, and the corresponding waveform shape is shown in the graph-oriented GUI 248. The list data portions 232 and corresponding parameter fields 236, 238 in the window 220 are updated by the applications 218 based on the powers 250a-205k selected for the graph-oriented GUI 248. In some examples, data values from a separate spreadsheet data file can be graphically dragged into the window 222 or pasted in the window 222 so as to provide user selected points in the graph-oriented GUI 248. In some examples, as the list data portions 232 are entered in the window 220, the corresponding waveform shape based on the raw parameter values of the list data portions 232 is graphically illustrated in the graph-oriented GUI 248. In typical embodiments, waveform repetitions and waveform modulation features are omitted from the waveform displayed in the graph-oriented GUI 248, simplifying the graphical representation.

Figure 2D:
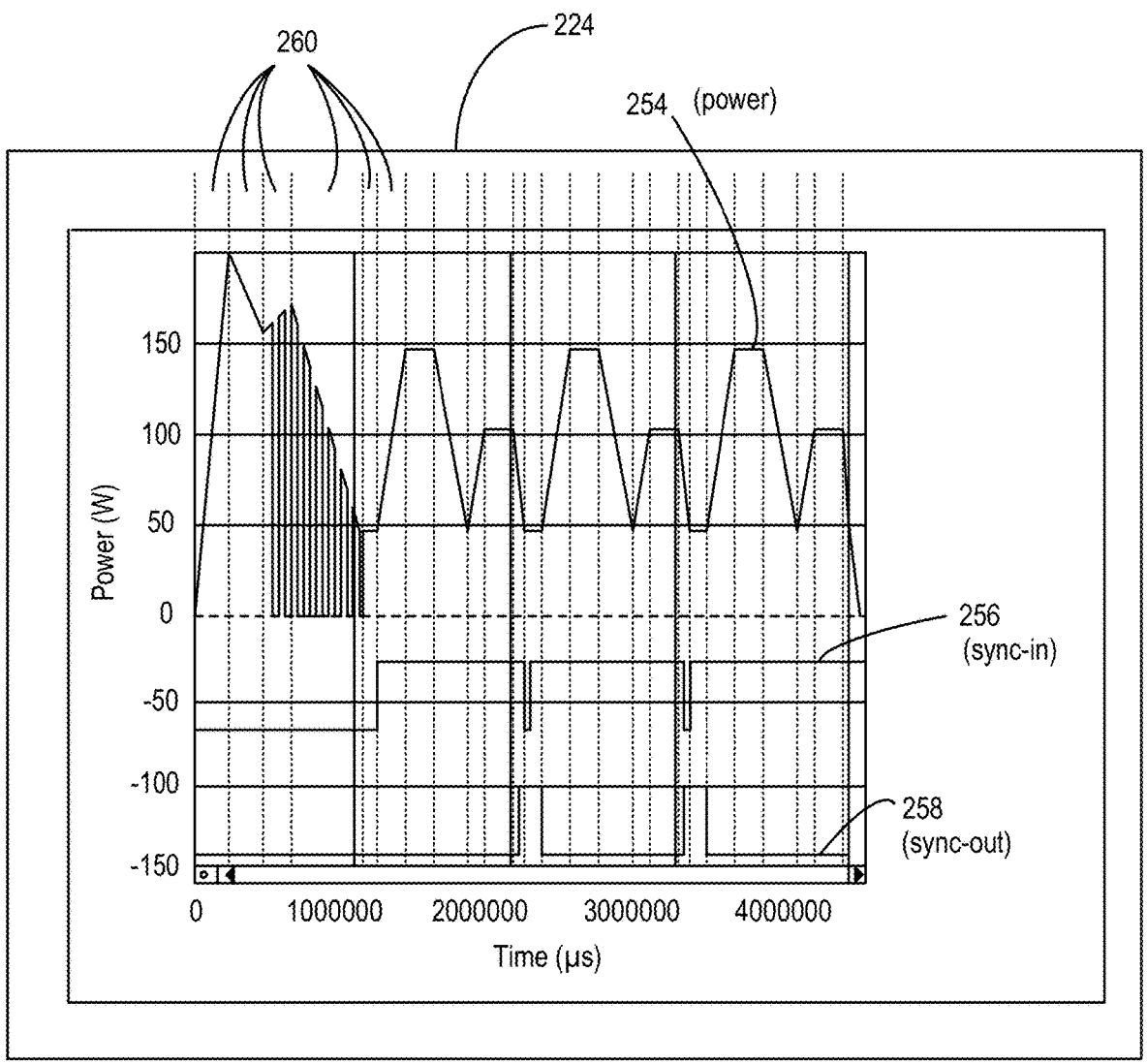
Figure 3:
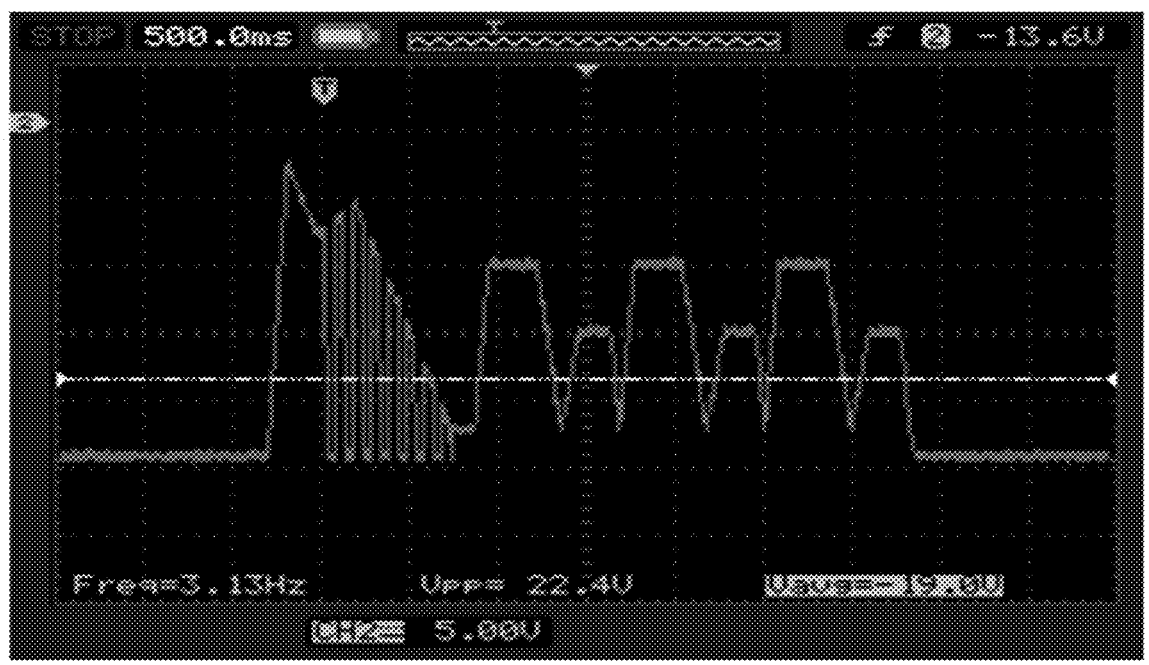
FIG. 3 is oscilloscope graph of a laser diode voltage.

Referring more particularly to FIG. 2D, the window 224 illustrates simulated waveforms 254, 256, 258 that are produced after selecting a 'simulate' graphical element 252, such as an icon or button, situated in the window 222. The illustrated simulated waveforms 254, 256, 258 can include a plurality of simulated waveform portions 260 that extend between initiation and termination values associated with one or more of the separate list data portions 232, though some simulated waveform portions 260 can extend between other values, such as between middle temporal positions of adjacent list data portions 232, and a plurality of simulated waveform portions 260 can correspond to one of the list data portions 232. In some examples, the simulated waveforms 254, 256, 258 correspond to precise visual representations of the waveform data list 230 entered by the user in the windows 220 or 222. Depending on the performance characteristics of the laser system that generates a waveform based on the waveform data list 230, the simulated waveform 254 can loosely or tightly correspond with an actual laser system waveform, including laser beam output, laser system pump output, or laser driver output. FIG. 3 shows an actual pump diode voltage detected during active operation of a laser system using a waveform corresponding to the waveform data list 230 and simulated in the window 224. A waveform coupled to or output from a laser system can deviate from the user entered waveform due to one or more slew rates or response time variations associated with laser system components, such as laser system controllers, laser drivers, power supplies, scanning mirrors, etc., and the deviation can be substantial so as to affect the quality of a corresponding laser process.

A waveform deviation can also occur due to optical-related delayed response times or other optical transient effects associated with pump sources and laser sources. For example, ramping or stepping a power in a laser medium can have a delay associated with the lasing process of the laser active media including propagation delays, semiconductor recombination times, current diffusion processes, etc. One or more overshoot transients can occur based on a preceding optical waveform power or energy stored in related active media. In some examples, the simulated waveform 254 is adjusted based on predicted waveform deviations, and in further examples the simulated waveform 254 is further adjusted and the list data portions 232 are adjusted so that an actual waveform produced by the laser system corresponds more closely with the unadjusted shape of the desired waveform entered by the user. List data portions 232 associated with one or more simulated waveform portions 260 that precede a selected list data portion 232 or simulated waveform portion 260 can also be adjusted so as to adjust the selected list data portion or simulated waveform portion 260. In some examples, additional parameters that vary with respect to time, characteristics, and operation of the laser system can also be modeled and used to adjust simulated and actual waveforms, such as pump laser diode temperature, laser diode or laser source threshold, etc.

Figure 4:
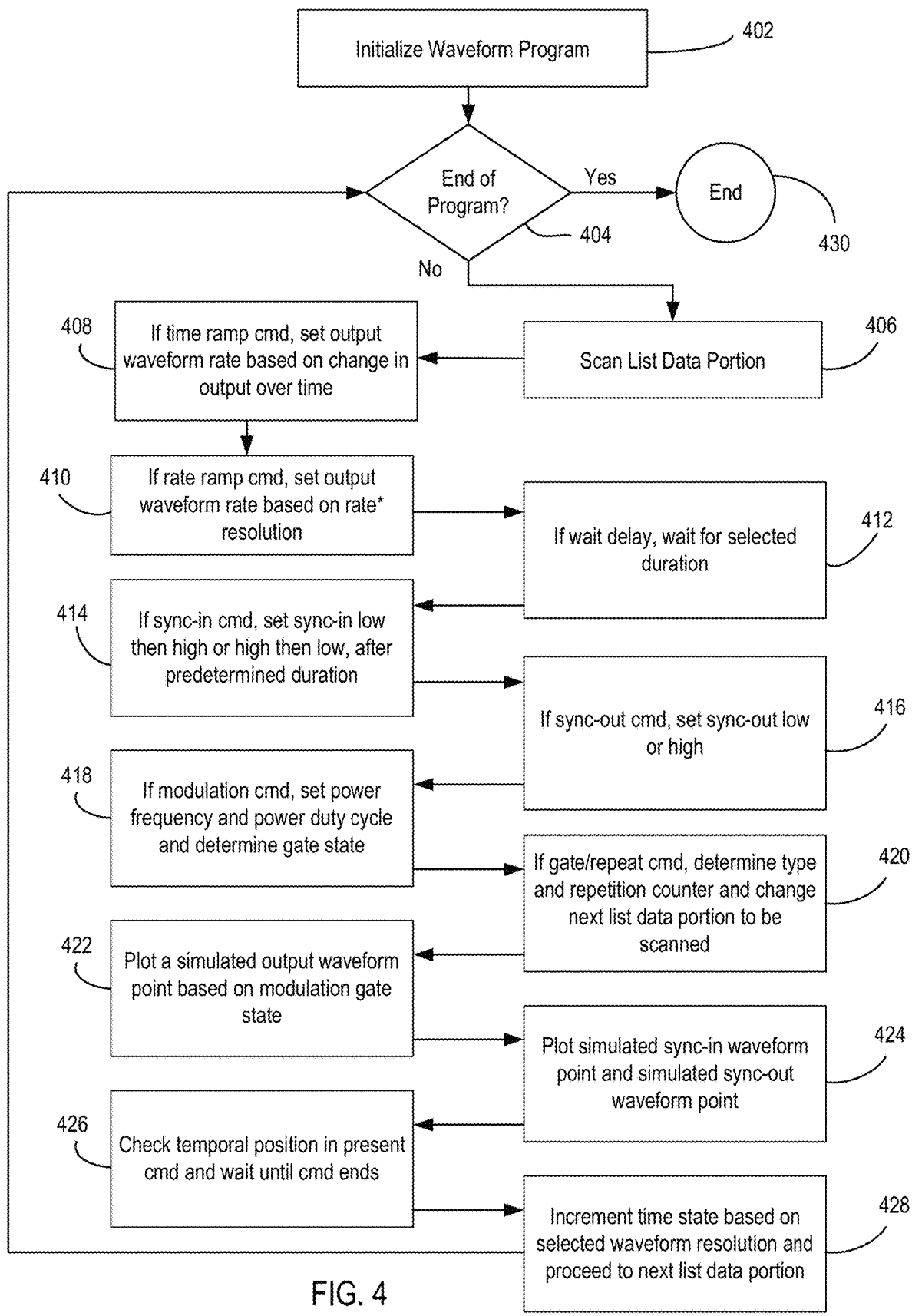
FIG. 4 is a flowchart of a method embodiment.

FIG. 4 depicts an example of a method 400 of simulating an output waveform associated with a laser system, such as a laser beam power, a pump source power, or a pump source supply current or voltage, and graphically representing the simulated output waveform. At 402, a waveform visualization program is initialized. After determining the end of the program has not been reached at 404, a first list data portion in a waveform data list is scanned at 406 for various types of waveform commands. For a time ramp command, at 408, an output waveform rate is set based on a desired change in the output waveform over time and corresponding duration and target power parameters. If a rate ramp command is provided, at 410, an output waveform rate is set based on a desired rate multiplied by a resolution of the simulated output waveform, with a power ramp rate and resolution parameters selected. For typical methods, the temporal resolution associated with a simulated waveform can be selected for the waveform program prior to initiation or selected waveform portions can have different resolutions so that the time required to produce the simulated waveform can be improved. For example, waveform portions that do not change or that change slowly over time may not to require a fine temporal resolution. Waveform portions with substantial power dynamics, such as on or off states, variation in sync-in or sync-out signals, waveform modulations, and changing waveform modulations, may benefit from finer resolution. Example resolutions can vary from less than or equal to 1 µs, 5 µs, 10 µs, 50 µs, 1000 µs, 1 s, 10 s, or greater. Thus, waveform shapes herein can correspond to a plurality of points at a provided resolution that correspond to the shape.

After a waveform reaches a predetermined level, such as a laser beam power, in some examples, at 412, a list data portion can include a wait delay command that maintains the predetermined level for a selected duration based on a wait duration parameter. At 414, one or more list data portions can provide simulated sync-in command which include various types of sync signals that depend on the external controller providing the sync-in signal and the type of laser process being implemented. In some examples, a simulated sync-in signal is set to a low state and then to a high state after a predetermined duration, such as 20 ms, or is set to a high state and then to a low state after the same or a different predetermined duration. At 416, one or more list data portions correspond to a sync-out command provided by the laser system and that is set to a low or high state. In some examples, a waveform modulation command is set at 418 that provides an alternating waveform level based on selected frequency and duty cycle parameters and a modulation gate state. Waveform modulation can alternate between various waveform output values, including between a maximum value and a zero value or other values.

In some embodiments, one or more list data portions can provide a waveform repeat command, at 420, that performs or repeats a selected set of list data portions. The repeat command can direct the waveform visualization program to go to a selected waveform command line and to iterate a repetition counter based on a selected repeat parameter value. Alternatively, the repeat command can select one or more list data portions at different positions to be repeated in a selected order. At 422, a simulated waveform point is plotted in a simulated graphical representation of the waveform. Modulation gate state values can override a particular commanded state so that a low state associated with a modulation command is plotted instead of the particular commanded state, such as a ramping waveform value. At 424, a sync-in point and a sync-out point are plotted so that the correspondence of the laser system waveform (or waveforms) can be visually compared with the sync-in signal and sync-out signal states. At 426, a check is performed to determine whether the current waveform visualization program command is completed. After completion of the command, at 428, a time state is incremented based on the selected waveform program resolution and the waveform visualization program proceeds to scan a subsequent list data portion at 406. If there are no remaining list data portions, the waveform visualization program can proceed to an end state at 430.

Figure 5:
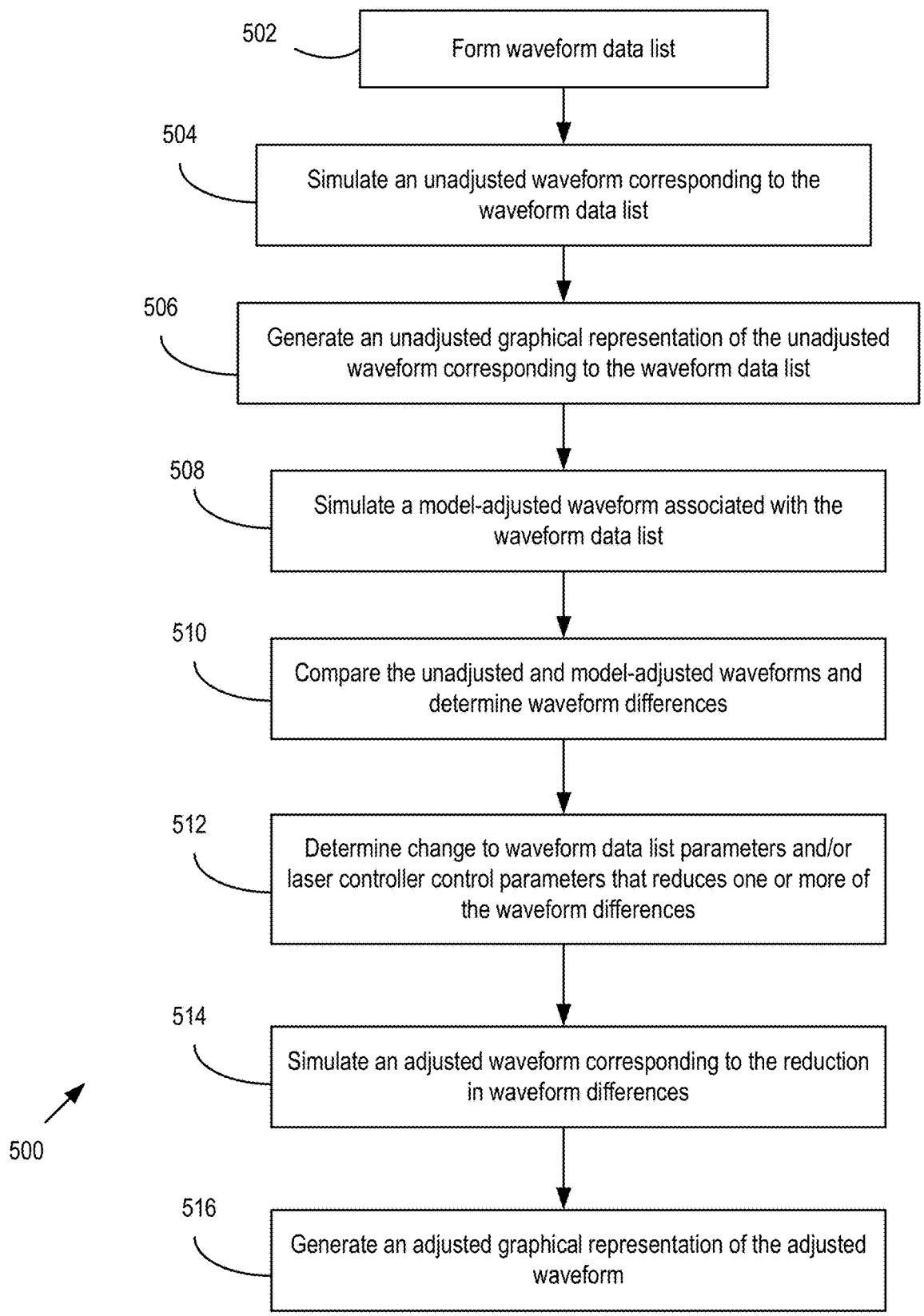
FIG. 5 is a flowchart of another method embodiment.

FIG. 5 is a flow diagram showing a method example 500 of simulating a waveform. At 502, a waveform data list is formed that includes a plurality of data list portions corresponding to separate waveform commands. For example, a laser device user can enter a plurality parameter values for the separate waveform commands based on a desired output beam shape or profile. An unadjusted waveform that corresponds to the waveform data list is simulated at 504. At 506, a graphical representation of the simulated unadjusted waveform is displayed. A model-adjusted waveform is simulated at 508. The model-adjusted waveform can be simulated based on the operational dynamics of the laser system generating the waveform and the targets receiving the waveform energy.

In some examples, the model-adjusted waveform is a waveform estimation that includes response characteristics and waveform effects associated with laser system electronics, such as one or more laser drivers. Electronics response dynamics can include RLC circuit delay, amplifier slew rate, FET nonlinearity, voltage supply line dynamics, etc. In further examples, the model-adjusted waveform is a waveform estimation that includes response characteristics and waveform effects associated with laser system optical components, such as pump and laser sources or other active media, lenses, mirrors, and scanning devices. For example, a pump laser beam power or an output laser beam power response to a power command request may vary between systems, commanded power levels, or preceding laser states or associated laser commands, such as modulation or repetition rates. Laser system dynamics can include predicted waveform rise times, fall times, and overshoots, and can vary based controller gain parameters set in a laser system controller and mechanical response times, such as scan mirror and movement stage accelerations and vibrational modes. In representative examples, model-adjusted waveforms of laser beam power typically incorporate one or more electronics response effects. In particular examples, the model-adjusted waveform is plotted and graphically represented for visual comparison with the unadjusted waveform.

At 510, the unadjusted waveform and the model-adjusted waveform are compared so as to determine waveform differences between them. For example, as initial or average initial time for a power rise or fall can be determined and a delay or advance assessed. Waveform rise times, fall times, overshoots, and areas can be quantified and compared. At 512, the changes to the waveform data list parameters, laser system controller control parameters, or both, that reduce one or more of the waveform differences are determined. At 514, an adjusted waveform is simulated that corresponds to the waveform differences that are reduced at 512, and at 516, an adjusted graphical representation of the simulated adjusted waveform is generated and displayed. In typical examples, one or more portions of the simulated adjusted waveform more closely match the unadjusted waveform on a selected timescale than the model-adjusted waveform. Thus, based on the modeled electronic, optical, and mechanical responses of laser system components, a laser system output can be molded or shaped to more closely match and coincide with features of a desired waveform shape, including timing, shape, and output levels. In some examples, a delay shown in a model-adjusted waveform can be measured or determined through one or more signal analysis techniques or comparisons, such as signal cross-correlation, convolution, etc. For waveforms with selected repetition rates, such as through modulated waveform portions or through repetitions of a plurality of waveform portions, some delays can correspond to a phase delay. Waveform programs can be updated based on the simulated adjusted outputs and executed by a laser system so as to produce the corrected waveform outputs.

In some examples, modeled responses can extend to physical models of specific laser-material interactions. In high power laser beam examples, given a specific cutting or welding pattern, material type and thickness, one or more laser system waveform programs or waveform program portions can be updated based on the laser-material interactions so that the adjusted waveform can produce a laser processed material with an improved quality or at a faster process rate. For example, a waveform data list can include a simple set of step commands (e.g., on/off) for laser beam output power levels and an improved weld quality may be associated with characteristic features in a more complex waveform, such as a ramped, or curved power delivery. A simulated adjusted waveform can incorporate the waveform differences associated with the laser target or laser target pattern, and a graphical representation can be displayed so as to confirm that a complex waveform will be produced by the laser system.

Figure 6:
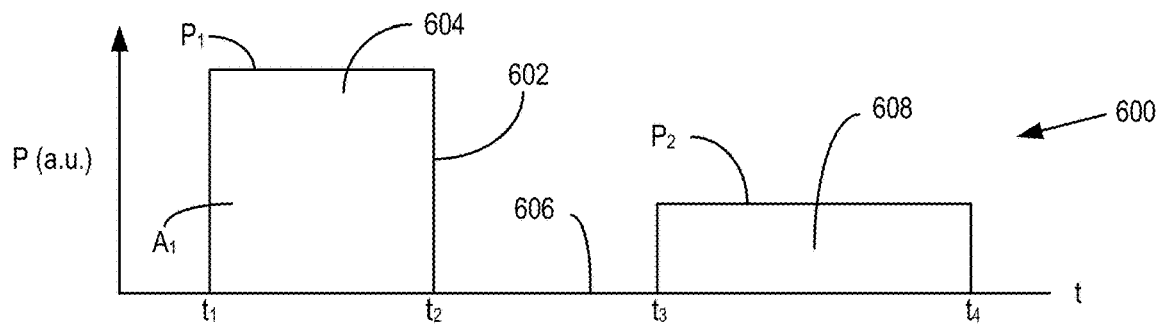
FIG. 6 illustrates example waveforms.
Figure 6:
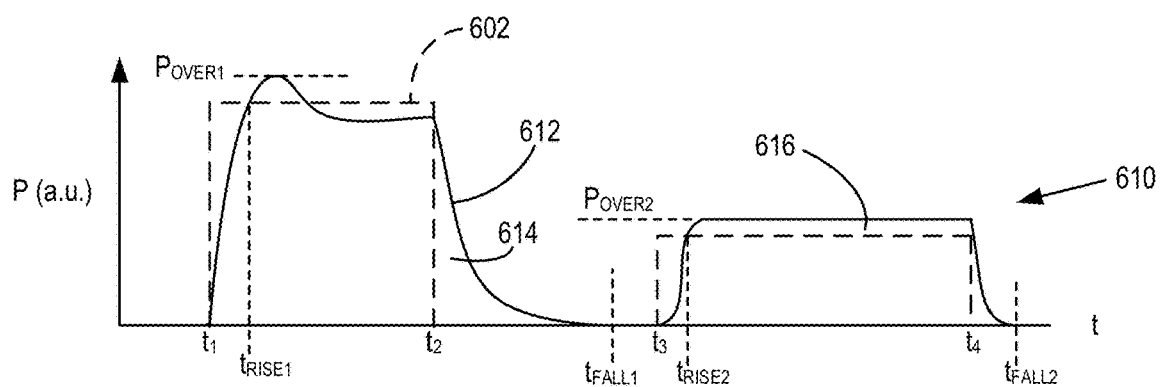
Figure 6:
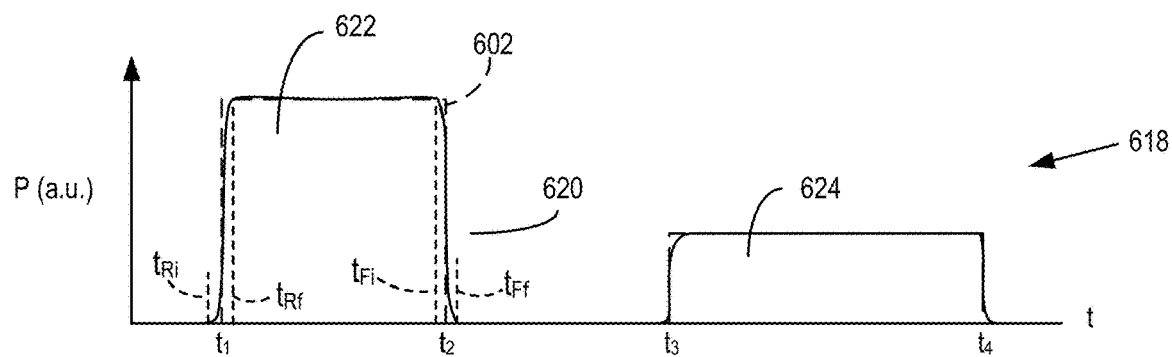
Figure 6:
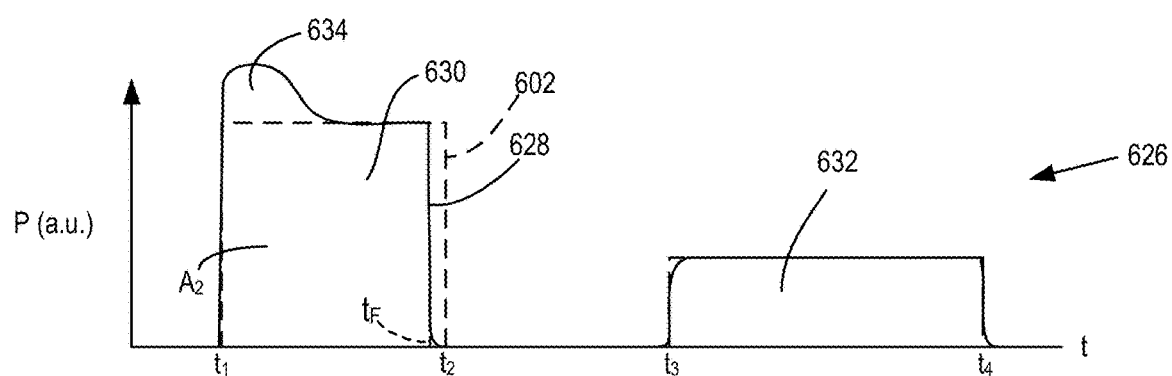

In FIG. 6, a waveform graph 600 shows an optical power waveform 602 that corresponds to a set of waveform command line instructions that produce an optical beam in a laser system. For a first portion 604 of the optical power waveform, at a time $t_1$, an optical power changes from a zero value to $P_1$ and at a time $t_2$ the optical power changes back to the zero value. After a selected delay portion 606, in a second portion 608 at a time $t_3$, the optical power changes to $P_2$ that is less than $P_1$ and then at time $t_4$ the optical power returns to the zero value. In typical laser processing examples, the optical power waveform 602 that is desired may not produce the corresponding waveform in the laser system upon implementation, or even if produced may not produce a superior result on the laser processing target.

Waveform graph 610 shows an optical power waveform 612 that is simulated for the laser system based on modeled laser system dynamics or that corresponds to a laser beam actually produced by the laser system. A first portion 614 of the optical power waveform 612 includes a rise time $t_{RISE1}$, an overshoot $P_{OVER1}$, and a fall time $t_{FALL1}$ of various durations, and a second portion 616 includes a rise time $t_{RISE2}$, an overshoot $P_{OVER2}$, and a fall time $t_{FALL2}$. The mismatch between the optical power waveform 612 and the desired optical power waveform 602 can result in laser processing errors, including misaligned patterns, insufficient laser energy, excessive laser energy, and sub-optimal processing.

Waveform graph 618 includes an adjusted optical power waveform 620 that is simulated or is an actual waveform output and corresponds to adjusted waveform command line instructions or controller gain parameters that can account for modeled laser system dynamics, such as the effects of laser system dynamics shown in the waveform graph 604. A first portion 622 of the adjusted optical power waveform 620 includes a shorter rise time $t_{Rf}-t_{Ri}$ (a difference between a final rise time $t_{Rf}$ and an initial rise time $t_{Ri}$) than the rise time $t_{RISE1}$ of the first portion 614 and a shorter fall time $t_{Ff}-t_{Fi}$ (a difference between a final fall time $t_{Ff}$ and an initial fall time $t_{Fi}$) than the fall time $t_{FALL1}$ of the first portion 614. Also, the initial rise time position $t_{Ri}$ occurs before the time $t_1$ and the initial fall time position $t_{Fi}$ occurs before the time $t_2$, providing a closer and more temporally-centered overlap between the first portion 622 of the adjusted optical power waveform 620 and the first portion 604 of the desired optical power waveform 602 than the first portion 614 of the simulated optical power waveform 612. Similarly, a second portion 624 of the adjusted optical power waveform 620 more closely matches the second portion 608 of the desired optical power waveform 602.

Waveform graph 626 includes an adjusted optical power waveform 628 that includes a first portion 630 and a second portion 632. For a particular laser-material interaction it may be advantageous for a laser process to include an initial power overshoot 634 that has a predetermined shape and duration which can be provided by adjusting waveform list commands and controller gain parameters associated with a modeled waveform, such as the simulated optical power waveform 612. In some examples, the introduction of a significant overshoot, such as the initial power overshoot 634, or another waveform shape variation may increase a waveform area above a waveform area $A_1$ (shown in waveform graph 600 for clarity) that may be desired based on a fluence or energy requirement of a laser process. The waveform area $A_2$ corresponding to the first portion 630 of the adjusted optical power waveform 628 can be controlled so as to match or more closely match the waveform area $A_1$ in various ways. For example, a waveform portion termination time $t_F$ can be advanced so that the area $A_2$ of the first portion 630 is decreased to correspond to the waveform area $A_1$. In some laser process examples, the initial power overshoot 634 may not be required or desired for different power levels or for different waveform portion durations, so that different waveform portions, such as the waveform portion 632, can have different shapes.

Any of the example simulation techniques can be performed by a computing system comprising a processor and memory (e.g., volatile or nonvolatile memory storing software for implementing any of the disclosed techniques) and/or by a simulation tool implemented by one or more computing devices. Further, any of the example techniques can be implemented as computer-executable instructions stored on a computer-readable storage media (e.g., a non-transitory computer-readable storage media, such as a hard drive or solid-state drive), which when executed by a computer cause the computer to perform the techniques. Further, any of the disclosed user interfaces can be displayed on a display device (e.g., computer monitor or touch screen) of such computing systems.

The disclosed methods, apparatus, and systems should not be construed as limiting in any way. Instead, the present disclosure is directed toward all novel and nonobvious features and aspects of the various disclosed embodiments, alone or in various combinations and subcombinations with one another. Furthermore, any features or aspects of the disclosed embodiments can be used in various combinations and subcombinations with one another. For example, one or more method acts or features from one embodiment can be used with one or more method acts or features from another embodiment and vice versa. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope and spirit of the appended claims.

I claim:

1. A system, comprising:
a laser system situated to generate a laser beam;
a controller situated to control a path of the laser beam on a target and to control a variation of one or more waveforms associated with the laser beam; and
a display coupled to the controller and situated to display a plurality of list data portions that include waveform parameters and a simulated waveform based on the plurality of list data portions, wherein the simulated waveform includes a plurality of simulated waveform portions that are predictive of the one or more waveforms;
wherein at least one of the simulated waveform portions includes a shape adjusted based on waveform differences between an unadjusted shape of the at least one simulated waveform portion and a model-adjusted shape of the at least one simulated waveform portion;
wherein the model-adjusted shape includes a waveform estimation that includes response characteristics of the laser system attributed to one or more of a laser driver waveform duration, laser beam power, laser beam modulation frequency, laser beam modulation duty cycle, laser beam repetition rate, scan mirror dynamics, movement stage dynamics, laser system electronics, or laser system optical components.

2. The system of claim 1, wherein the display is a graphical user interface (GUI) that further includes a graphically selectable waveform generator and the plurality of list data portions are updatable to include waveform parameter values that correspond to a shape selected in the graphically selectable waveform generator.

3. The system of claim 1, wherein the display is a graphical user interface (GUI) that further includes a graphically selectable waveform generator that is situated to generate a selected waveform that corresponds to list data portion waveform parameter value inputs received from a user.

4. The system of claim 1, wherein at least one of the simulated waveform portions includes a shape adjusted based on a slew rate of a laser system component of the laser system or a transient optical effect associated with a laser system component of the laser system.

5. The system of claim 4, further comprising a processor coupled to the display and situated to generate a plurality of controller waveform commands that correspond to the simulated waveform.

6. The system of claim 5, wherein the controller is situated to receive the controller waveform commands and to generate the laser beam based on the controller waveform commands.

7. The system of claim 4, further comprising a processor in communication with the controller and configured to generate and send a plurality of controller waveform commands to the controller that correspond to the simulated waveform.

8. The system of claim 7, wherein the laser system is in communication with the controller and is configured to generate the laser beam based on the controller waveform commands.

9. The system of claim 1, wherein at least one of the simulated waveform portions includes a shape adjusted based on a waveform shape or waveform parameter value of one or more preceding simulated waveform portions.

10. The system of claim 1, further comprising a processor coupled to the display and situated to generate a plurality of controller waveform commands that correspond to the plurality of list data portions.

11. The system of claim 1, wherein the waveform parameters include one or more of a laser beam waveform or laser driver waveform duration, power, modulation frequency, modulation duty cycle, and waveform repetition quantity.

12. The system of claim 1, wherein the waveform differences include one or more of a phase, timing advance or delay, or a cross-correlation.

13. The system of claim 1, wherein gain parameters in the controller are varied so that a rise time, fall time, or overshoot of the model-adjusted shape are adjusted to decrease one or more of the waveform differences.

14. The system of claim 1, wherein the laser system includes one or more pump laser diodes, and the one or more waveforms is a supply voltage coupled to the one or more pump laser diodes.

15. The system of claim 1, wherein the one or more waveforms is an optical power of the laser beam at the target.

16. The system of claim 1, wherein a waveform area of the at least one simulated waveform portion is adjusted based on the waveform differences so that a laser fluence associated with the waveform area is closer to a laser fluence associated with a waveform area of the unadjusted shape.

17. The system of claim 1, further comprising a processor in communication with the controller and configured to generate and send a plurality of controller waveform commands to the controller that correspond to the plurality of list data portions.

18. A method, comprising:
forming a plurality of list data portions including laser waveform parameters that are associated with a plurality of waveform portions of a waveform associated with a laser system;
simulating the waveform based on the plurality of list data portions so as to produce a simulated waveform that includes a plurality of simulated waveform portions that are predictive of the waveform portions; and
displaying the simulated waveform on a display;
wherein at least one of the simulated waveform portions includes a shape adjusted based on waveform differences between an unadjusted shape of the at least one simulated waveform portion and a model-adjusted shape of the at least one simulated waveform portion;
wherein the model-adjusted shape includes a waveform estimation that includes response characteristics of the laser system attributed to one or more of a laser driver waveform duration, laser beam power, laser beam modulation frequency, laser beam modulation duty cycle, laser beam repetition rate, scan mirror dynamics, movement stage dynamics, laser system electronics, or laser system optical components.

19. The method of claim 18, wherein the simulating includes adjusting a shape of at least one of the simulated waveform portions based on waveform differences between an unadjusted shape of at least one of the simulated laser waveform portions and a model-adjusted shape of the at least one simulated laser waveform portion.

20. The method of claim 18, wherein the simulating includes adjusting a shape of at least one simulated waveform portion based on a slew rate of a laser system component of the laser system or a transient optical effect associated with a laser system component.

21. The method of claim 18, wherein at least one of the simulated waveform portions includes a shape adjusted based on a waveform shape or waveform parameter value of one or more preceding simulated waveform portions.

22. A system, comprising:
a graphical user interface (GUI);
at least one processor; and
one or more computer-readable storage media including stored instructions that, responsive to execution by the at least one processor, cause the system to display on the GUI a plurality of list data portions that correspond to waveform parameters of a plurality of output laser waveform portions of an output laser waveform and to display a simulated output laser waveform that is generated based on the plurality of list data portions, wherein the simulated output laser waveform includes a plurality of simulated output laser waveform portions that are predictive of the output laser waveform;
wherein at least one of the simulated waveform portions includes a shape adjusted based on waveform differences between an unadjusted shape of the at least one simulated waveform portion and a model-adjusted shape of the at least one simulated waveform portion;
wherein the model-adjusted shape includes a waveform estimation that includes response characteristics of a laser system attributed to one or more of a laser driver waveform duration, laser beam power, laser beam modulation frequency, laser beam modulation duty cycle, laser beam repetition rate, scan mirror dynamics, movement stage dynamics, laser system electronics, or laser system optical components.

23. The system of claim 22, wherein a selected simulated output laser waveform portion is adjusted based on a waveform difference between an unadjusted shape of the selected simulated output laser waveform portion and a model-adjusted shape of the selected simulated output laser waveform portion.

24. The system of claim 22, wherein at least one of the simulated waveform portions includes a shape adjusted based on a slew rate of a laser system component of the laser system or a transient optical effect associated with a laser system component of the laser system.

* * * * *